(12) United States Patent
Stowe et al.

(10) Patent No.: US 6,489,776 B1
(45) Date of Patent: Dec. 3, 2002

(54) NON-CONTACT MECHANICAL RESONANCE METHOD FOR DETERMINING THE NEAR SURFACE CARRIER MOBILITY IN CONDUCTORS

(75) Inventors: Timothy D. Stowe, Palo Alto, CA (US); Daniel Rugar, Los Altos, CA (US); Thomas W. Kenny, San Carlos, CA (US)

(73) Assignees: The Board of Trustees of the Leland Stanford Junior University, Stanford, CT (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/705,523

(22) Filed: Nov. 2, 2000

Related U.S. Application Data

(60) Provisional application No. 60/163,119, filed on Nov. 2, 1999.

(51) Int. Cl.[7] ................ G01R 29/12; G01R 23/00; G01R 31/00; G01R 19/18; G01R 27/26
(52) U.S. Cl. ............... 324/458; 324/76.49; 324/96; 324/118; 324/658
(58) Field of Search ............... 324/458, 96, 118, 324/76.49, 76.51, 658, 762, 240, 452, 702

(56) References Cited

U.S. PATENT DOCUMENTS

| | | | | |
|---|---|---|---|---|
| 3,195,037 A | * | 7/1965 | Van Nie ............... 324/118 |
| 4,302,721 A | | 11/1981 | Urbanek et al. ............ 324/226 |
| 4,649,336 A | * | 3/1987 | Binder et al. ............... 324/118 |
| 4,894,607 A | * | 1/1990 | Kumada ..................... 324/96 |
| 5,065,103 A | * | 11/1991 | Slinkman et al. ........... 324/458 |
| 5,442,297 A | | 8/1995 | Verkuil ....................... 324/702 |
| 5,517,123 A | * | 5/1996 | Zhao et al. ................. 324/458 |
| 5,959,447 A | * | 9/1999 | Bridges et al. ............. 324/458 |

OTHER PUBLICATIONS

T. D. Stowe et al; "Attonewton force detection using ultrathin silicon cantilevers;" Appl. Phys. Lett., vol. 71, No. 2, Jul. 14, 1997.

\* cited by examiner

*Primary Examiner*—N. Le
*Assistant Examiner*—Anjan K. Deb
(74) *Attorney, Agent, or Firm*—Lumen Intellectual Property Services, Inc.

(57) ABSTRACT

An apparatus using a resonator probe for determining an electronic property of a conductor across a dielectric. The apparatus has a device for inducing lateral mechanical oscillations of the resonator probe and a voltage source for producing a voltage difference between the resonator probe and the conductor to create an electronic drag between the conductor and resonator probe, thus damping the mechanical oscillations of the probe. The electronic property, such as charge carrier mobility, surface resistance, charge carrier lifetime and the number of charge carriers is determined from the damping experienced by the probe.

19 Claims, 4 Drawing Sheets

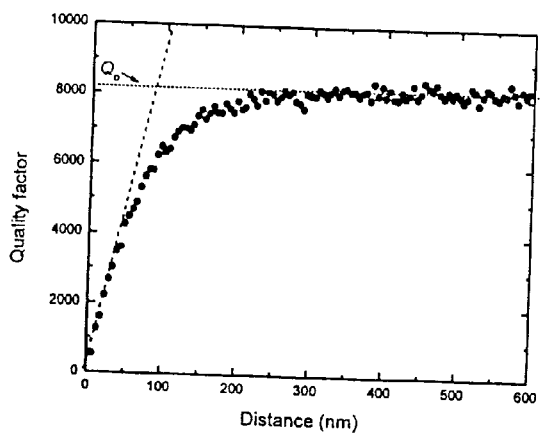

A graph of the quality factor vs. tip-sample distance for $V_s=2$ volts and an n-type 0.015 Ω-cm sample. Far from the surface the $Q$ asymptotically approaches the intrinsic value $Q_o=8000$. Close to the surface the $Q$ decreases linearly with distance.

FIG. 2

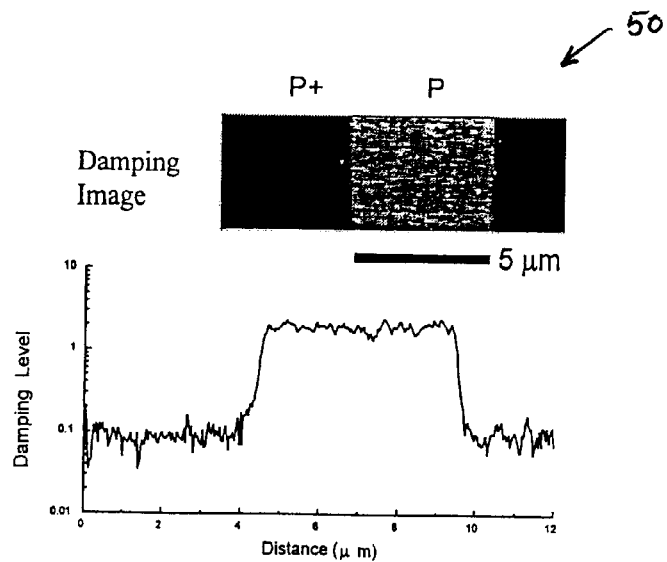

A damping image of a $p^+/p$ test grating. The spatial resolution based upon the width of the transition region is on the order of 200 nm.

FIG. 3

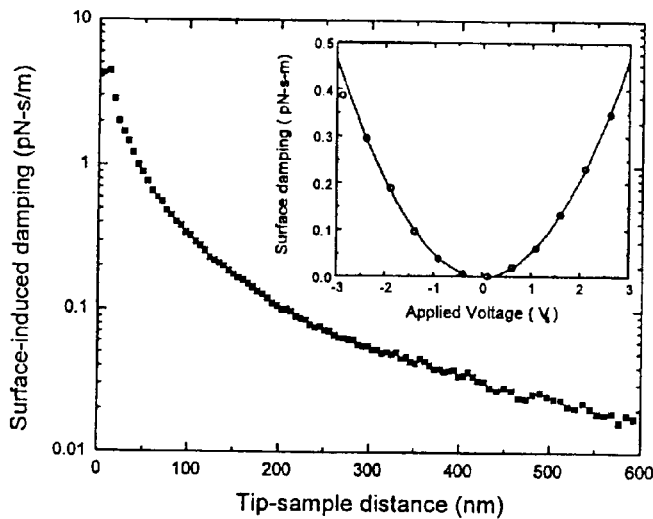

*The surface-induced damping vs. distance over a 0.1 Ω cm p-type silicon sample for $V_s=2$ volts. The inset shows this damping vs. applied voltage at $z_0=150$ nm.*

FIG. 4

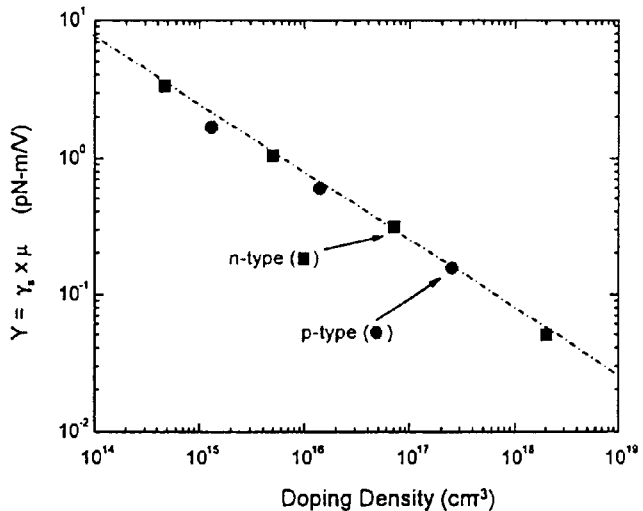

shows a plot of the measured relationship between surface damping, mobility, and doping density. The $N^{-1/2}$ dependence predicted by equation (4) is clearly demonstrated for doping concentrations between $10^{14}$-$10^{18}$ cm$^{-3}$. Thus the electronic drag has a direct correlation to the doping concentration in the sample.

FIG. 5

NON-CONTACT MECHANICAL RESONANCE METHOD FOR DETERMINING THE NEAR SURFACE CARRIER MOBILITY IN CONDUCTORS

RELATED APPLICATIONS

This application claims the benefit of provisional patent application No. 60/163,119 filed Nov. 2, 1999, which is herein incorporated by reference.

STATEMENT REGARDING FEDERALLY SPONSORED RESEARCH OR DEVELOPMENT

This invention was supported in part by grant number ECS-9422255 from the National Science Foundation (NSF). The U.S. Government has certain rights in the invention.

FIELD OF THE INVENTION

This invention relates generally to nondestructive evaluation of semiconductor materials. More particularly, it relates to a non-contact method for determining the mobility properties below a dielectric/semiconductor interface.

BACKGROUND

Nondestructive evaluation and testing has achieved widespread industrial use. In the construction and automobile manufacturing industry, eddy current testing is used for the evaluation of steel welds and ultrasonic testing for the critical dimension measurement of manufactured parts. Eddy current testing measures the quality of steel welds by measuring inductive losses in the mental parts and ultrasonic testing looks at the phase of reflected sound waves to measure the critical dimensions of parts.

Over the past decade, the semiconductor industry has used nondestructive evaluation for a variety of measurements. As with other manufacturing sectors, critical dimensions device analysis is important for quality control of transistor devices. Critical dimensions can be found. from in-line contactless scanning electron micrographs (in-line SEM) or by tapping mode atomic force microscopy (AFM) for submicron profilometry.

Other areas which require nondestructive evaluation are measurements of doping profiles, integrated sheet resistance and carrier lifetimes. The most common means of measuring such semiconductor quantities is by fabricating test structures during the production run and probing them later. For example, from the current voltage characteristics of the so-called "4-point-probe" test structure, the integrated sheet resistance of an implanted or epitaxially grown region can be determined. Another example is the use of Hall probe test structures for the characterization of the type (i.e., a donor or acceptor) and background doping concentration. Such post-processing evaluation techniques require special test structures to be built during wafer production. Physical and electrical contact is made with the test devices on the wafer. If dopant profiling across the wafer needs to be performed, a series of spreading-resistance measurements must be made. Once pulled from the production mainline, such wafers are considered contaminated and are not placed back into the mainline for further processing. Obviously, such testing is important for quality control during integrated circuit fabrication but such contact testing is both time consuming and wasteful of wafer real estate.

Given the limitations of the above-mentioned testing methods, there has been a move in the semiconductor industry towards contactless, in-line, nondestructive evaluation. One of the first successful methods of this type was developed by Therma-Wave, Inc. of California. The method relies on using a laser to excite thermal waves in the test sample. Dopants, impurities and lattice imperfections in the sample affect the propagation of the thermal wave. Hence, a measurement of the thermal wave in the test sample, e.g., magnitude of the thermal wave, damping coefficients etc., give an indication of the sample properties. This method has been a very successful and has lead to the development of a variety of new in-situ contactless metrology tools.

Noncontact measurement of bulk wafer sheet-resistance was achieved through the use of eddy current loss measurements and is described, e.g., in U.S. Pat. No. 4,302,721 to Urbanek et al. If the wafer thickness is known, e.g., obtained from an ultrasonic test, then the sheet resistance of the wafer can be calculated without the need to make special test structures through a measurement of eddy current loss. Eddy current testers can measure the integrated sheet resistance on a bulk wafer or a highly conductive layer on top of a high resistivity substrate with a spatial resolution of 1 mm. In addition to measuring bulk sheet resistance, the eddy current method can be used for measuring bulk carrier lifetimes when combined with other measurement techniques. Unfortunately, eddy current testing can not provide specific information about the doping profile and carrier mobility separately. A resistance vs. depth profile can be generated but it does not give yield accurate measurements of carrier mobility at distances less than one Debye Length ($L_d$) from the surface.

To obtain higher quality near surface metrology, standardized capacitance vs. voltage (C-V measurements) must be performed on MOS devices. This technique involves recording the capacitance of a MOS device versus the applied gate voltage. C-V measurements help to characterize both the charge state of a passivating gate oxide and the doping level of the silicon near the silicon dioxide interface. Traditionally, C-V measurements are performed on MOS test structures fabricated next to integrated circuit devices. More recently, mercury probes have been used to make a temporary metal contact of known area after the gate oxide is grown. After performing C-V measurements, the temporary mercury contact is removed from a wafer with a vacuum needle designed to retract the mercury. However, given the cross contamination concerns, the semiconductor industry usually discards these wafers after testing. More recent advances and techniques for performing C-V measurements can be found, e.g., in U.S. Pat. No. 5,065,103 to J. A. Slinkman et al. and other literature. Unfortunately, C-V test require significant surface preparation and can not be performed over active devices.

Surface photovoltage measurements (SPV) can also be used as a contactless method for probing semiconductor properties near the surface of a semiconductor wafer. In the SPV method the surface of the wafer being examined is illuminated with a sequence of high intensity laser pulses with a photon energy greater than the silicon bandgap. These pulses induce a change in the equilibrium carrier population in the conduction and valence band. This in turn leads to an oscillating photovoltage which can be capacitively sensed and then measured as a function of a DC voltage bias. Such surface photovoltage measurements can be used to measure carrier lifetimes, band bending and carrier concentration near the surface. Further information of the application of this method to sheet resistance measurements is found in U.S. Pat. No. 5,442,297 to Verkuil.

More recently, SPV measurements have been combined with a new measurement technique under the trademark Quantox, which relies on the deposition of ionized charge on the top layer of a gate oxide. The deposited charge is created using a corona method to ionize air molecules. The amount of charge that is deposited on the surface of the wafer can be inferred from a coulombmeter placed in series with the wafer chuck. By plotting the charge deposition versus the surface photovoltage, near surface doping and the trapped oxide charge density (interface trapped charge, mobile ionic charge and permanent charge densities) can be accurately determined.

Despite the above advances in the art, there is still a lack of effective methods for measuring a number of electronic properties of conductors in the near-surface region. Such measurements are especially important in measuring electronic properties such as carrier mobility of both majority and minority charge carriers in semiconductors very close to the surface. For example, at present there is no contactless in-situ method for the nondestructive evaluation of the near surface carrier mobility that can be used as a diagnostic tool prior to the testing of post-processed transistors. A nondestructive, contactless technique for determining the near surface carrier mobility and device characteristics related to mobility during the initial stages of fabrication would be a valuable metrology tool.

OBJECTS AND ADVANTAGES

In view of the above, it is a primary object of the invention to provide an apparatus and a method for measuring near-surface charge mobility in conductors across a dielectric. Specifically, it is an object of the invention to provide for contactless and non-destructive measurement of electronic properties of both minority and majority charge carriers in conductors. These measurements include electronic properties such as mobility, lifetime and surface resistivity in the region close to the conductor and dielectric interface.

It is another object of the invention to provide a nondestructive method of measuring electronic properties of various types of conductors including semiconductors and conducting polymers.

These and other objects and advantages will become apparent upon reading the detailed description.

SUMMARY

The objects and advantages of the invention are achieved by an apparatus using a resonator probe for determining an electronic property of a conductor across a dielectric. The resonator probe is positioned a certain distance from the conductor. The apparatus has a device for inducing lateral mechanical oscillations of the resonator probe and a voltage source for producing a voltage difference between the resonator probe and the conductor. The voltage difference creates an electronic drag between the conductor and resonator probe. The lateral oscillation of the resonator probe experiences a damping due to the electronic drag. A unit belonging to the apparatus determines the electronic property of the conductor from the damping of the oscillations of the resonator probe.

There are many possible devices for inducing mechanical oscillations of the resonator probe. For example, in one embodiment the device for inducing, the mechanical oscillations is a capacitive drive positioned near the resonator probe. Similarly, there are many units which can monitor the mechanical oscillations of the resonator probe. In one embodiment, the unit is an optical oscillation monitoring system. Furthermore, the oscillation monitoring unit conveniently includes logic or processing circuits for determining the damping and/or the Q-factor of the resonator probe. Also, in one embodiment of the invention, the apparatus is further equipped with a distance control for controlling and adjusting the distance between the resonator probe and the conductor.

The resonator probe in which the mechanical oscillations are induced can have various form factors. For example, the resonator probe can have one or more resonator members. In one embodiment, the resonator probe has two resonator members or arms extending parallel to each other thus forming a tuning fork. For measurements on millimeter scales, as is typically desired in industry, measurements can be performed using a piezoelectric tuning fork quartz oscillator using conventional electronic circuitry. In another embodiment, the resonator probe has only one resonator member in the form of a cantilever. Other designs can employ resonator members with more than two arms.

The voltage source of the apparatus is conveniently a versatile source capable of producing a positive and a negative voltage difference between the conductor and the resonator probe. This permits the user to study the electronic properties of both majority and minority charge carriers. The many properties which can be studied with the apparatus of the invention include parameters such as quantity of charge carriers, surface mobility of charge carriers, surface resistivity and charge carrier lifetime. These properties can be studied in conductors such as metal conductors, semiconductors and organic conductors. In any of these, the dielectric can be any dielectric or dielectric. layer including the naturally forming oxide layer or a layer such as passivation or protective layer purposely deposited on the conductor.

The method of the invention is practiced by first positioning the resonator probe above the dielectric and inducing lateral mechanical oscillations in the resonator probe. The voltage difference applied between the resonator probe and the conductor will affect the amount of electronic drag and hence the strength of the damping action. Thus, a comparison of the damping action at various voltage differences, e.g., no voltage difference and a particular voltage difference, yields information about the electronic drag and thereby about the electronic properties.

As mentioned above, the mechanical oscillations induced in the resonator probe can be applied by any suitable device. It should be noted, that in cases where air resistance plays a significant role in damping the oscillations the resonator probe can be operated in a vacuum.

The method of the invention is particularly useful for monitoring carrier mobility in the inversion layer underneath the gate-oxide prior to MOSFET fabrication. In addition to traditional silicon MOSFETs, the current method can be used to measure mobilities in conducting polymers used in organic semiconductor light emitting diodes and organic transistors.

The specifics of the apparatus and method of the invention as well as its applications are discussed in the detailed description in reference to the attached drawing figures.

BRIEF DESCRIPTION OF THE FIGURES

FIG. 2 is a graph illustrating the Q factor versus tip sample distance.

FIG. 3 is an image of a sample and the damping graph obtained for the sample using the apparatus of FIG. 1.

FIG. 4 is a function of damping versus distance between resonant probe tip and sample.

FIG. 5 is a graph illustrating a relationship between surface damping, mobility and dopant density.

DETAILED DESCRIPTION

The present invention provides a nondestructive, non-contact method for determining one or more electronic properties of charge carriers near an interface between a conductor and a dielectric. For example, the present method can be used to measure the charge carrier mobility near an interface between a conductor and a dielectric. The charge carriers can be majority or minority carriers such as electrons or holes.

Figure 1:
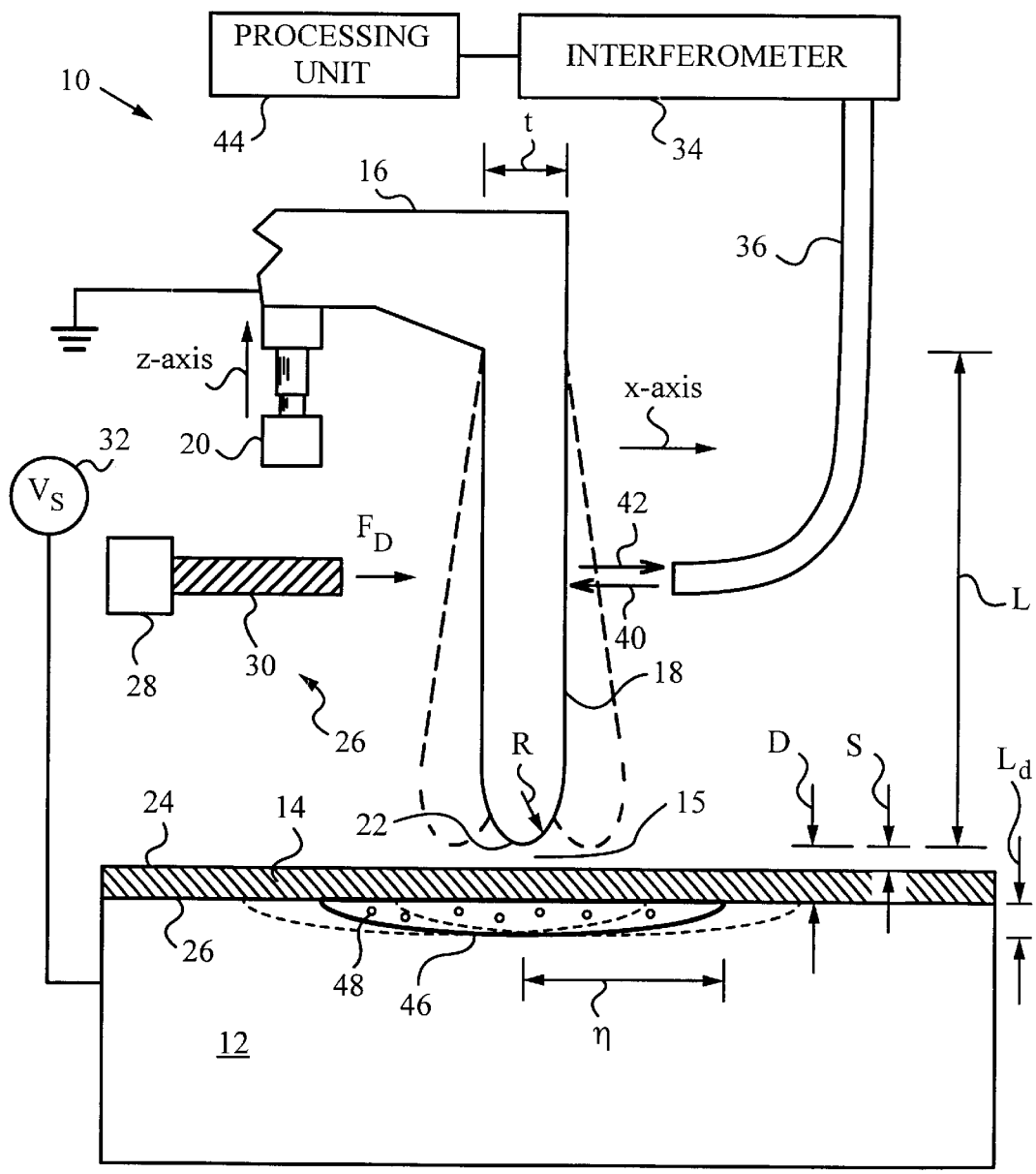
FIG. 1 is a plan sectional view illustrating an apparatus with a resonator probe having a single resonator member according to the invention.

An exemplary apparatus 10 for determining an electronic property of a conductor 12 across a layer of a dielectric 14 is shown in FIG. 1. Apparatus 10 has a resonator probe 16 with a single resonator member 18. In this case the resonator probe 16 is a micromechanical resonator and resonator member 18 is a micromachined cantilever or microcantilever of length L and thickness t. For example, cantilever 18 is an ultrathin single-crystal-silicon cantilever with L=100 $\mu$m and t=0.1 $\mu$m to 1.0 $\mu$m capable of measuring forces of less than 0.1 fN/Hz$^{-\frac{1}{2}}$ at room temperature. Information on how to make such cantilevers can be found in literature such as T. Stowe, et al., *Attonewton Force Detection Using Ultrathin Silicon Cantilevers,* Applied Physics Letters, No. 71, 1997, pp. 288–90.

Conductor 12 can be a metal conductor, a conductive polymer, a semiconductor, an organic conductor or any other conductor whose electronic properties are to be examined. In case conductor 12 is a metal, dielectric 14 can be the naturally forming oxide layer or any other dielectric. Of course, dielectric 14 can also be a passivating layer or a protective layer deposited on top of conductor 12. For example, when conductor 12 is a semiconductor a protective layer of SiO$_2$ is frequently used as dielectric 14. In case conductor 12 is an organic material or a conductive polymer many types of dielectric materials can be used as a protective layer. A person skilled in the art will recognize that is some cases no layer of dielectric 14 will be present.

In addition to dielectric 14, there is also a gap 15 between cantilever 18 and conductor 12. Gap 15 is typically filled with an atmosphere, e.g., ambient air or a special gas. In some cases, gap 15 is devoid of any gases. This is the case when the measurement of the electronic property or properties of conductor 12 is being performed in a vacuum. In any event, whether filled with a gas or under vacuum, gap 15 also acts as a dielectric. Hence, the electrical property of conductor 12 is actually measured across two dielectrics in the present embodiment.

Resonator probe 16 is positioned a certain distance D above conductor 12 with the aid of a stage or distance control 20. In particular, distance D is the distance between a tip 22 of cantilever 18 and an interface 26 between dielectric 14 and conductor 12. A distance S is the distance between tip 22 and a surface 24 of dielectric 14. Thus, the thickness of the first dielectric or, equivalently the size of gap 15 is S and the thickness of the layer of dielectric 14 is D-S.

In the present embodiment control 20 is a raising and lowering stage which moves resonator probe 16 up and down along a vertical direction indicated by the z-axis. For good measurement resolution control 20 should preferably be capable of adjusting size S of gap 15 from a few tens of nanometers to several hundred nanometers.

Apparatus 10 has a device 26 for inducing lateral mechanical oscillations of resonator probe 16, and specifically of its cantilever 18. In the present embodiment device 26 is a capacitive drive. Capacitive drive 26 has a voltage source 28 and a metal wire 30 on which an electrostatic charge can accumulate. The accumulation of electrostatic charge on wire 28 causes an opposite charge to accumulate on cantilever 18 in accordance with Coulomb's law and thus an electrostatic drive force $F_D$ is applied to cantilever 18. Other suitable methods of delivering a drive force to cantilever 18 include piezoelectric actuation and resonant thermal techniques.

Apparatus 10 has a unit 34 for monitoring the lateral mechanical oscillations of cantilever 18 of resonant probe 16. A person skilled in the art will recognize that numerous types of methods including optical, electronic or acoustic can be employed for this purpose. In the present embodiment unit 34 is an optical oscillation monitoring system, and specifically an optical interferometer. Interferometer 34 has a fiber 36 for illuminating cantilever 18 with a test light 40 and receiving a scattered light 42 from cantilever 18. Interferometer 34 employs standard interferometric techniques to determine the mechanical oscillations of cantilever 18 by comparing the phase of test light 40 with the phase of scattered light 42. Interferometer 34 also has a logic or processing unit 44 for processing the information obtained from the interferometric measurements. Unit 44 can be a dedicated logic circuit or a computer.

A voltage source 32 is provided for producing a voltage difference between resonator probe 16 and conductor 12. In this embodiment voltage source 32 delivers a voltage $V_S$ and is connected directly to conductor 12. Resonator probe 16 is connected to ground. Source 32 is preferably adjustable and capable of producing positive and negative voltages $V_S$ with respect to ground to thus set up positive and negative voltage differences (biases) ranging from +$V_S$ to –$V_S$ between probe 16 and conductor 12.

The application of voltage difference $V_S$ between cantilever 18 and conductor 12 induces a charge distribution 46 of charge carriers 48. Depending on whether voltage difference $V_S$ is positive or negative, charge carriers 48 are majority or minority charge carriers. The amount of electric charge q accumulated in distribution 46 is proportional to voltage difference $V_S$, with the proportionality constant being a capacitance C between tip 22 and conductor 12, or q=C$V_S$. The depth of charge distribution 46 is governed by a screening length $L_d$, also known as the Debye length, in this case extending from interface 26 into conductor 12. Charge distribution 46 has a radius $\eta$ governed by distance D between tip 22 and interface 26 to conductor 12, as well as the radius of curvature of tip 22 indicated in FIG. 1 by R.

In accordance with the invention, an electronic property or properties of conductor 12 are determined from the electromechanical coupling or electronic drag between cantilever 18 and charge distribution 46. The electronic drag is experienced by charges 48 when cantilever 18 is moved. Charges 48 follow the motion of cantilever 18 by generating a surface current i. Surface current i of charges 48 experiences a resistance r in conductor 12 and hence energy is lost. In particular, energy is lost by charges 48 to conductor 12 in a process frequently referred to as Ohmic heating. The energy lost to Ohmic heating is extracted from the energy of moving cantilever 18. In other words, cantilever 18 experiences a breaking action or damping action on its movements because of Ohmic heating.

To measure an electronic property of conductor 12 in the present embodiment drive force $F_D$ is applied along a lateral direction indicated by the x-axis. The application of drive force $F_D$ along this direction causes cantilever 18 to undergo lateral mechanical oscillations about its rest position. The oscillatory motion of cantilever 18 is indicated in dashed lines. The electronic drag between cantilever 18 and conductor 12 dampens these lateral oscillations as charge distribution 46 follows the oscillatory movement of tip 22 of cantilever 18 as indicated in dashed lines.

In order to eliminate the effect of other damping sources acting on cantilever 18 as much as possible it is convenient to set up drive 26 to drive cantilever 18 at or near one of its resonance frequencies (e.g., the fundamental or lowest resonance frequency) at a controlled amplitude. In situations where damping caused by the atmosphere has a significant effect on lateral oscillations of cantilever 18 the measurement can be performed in vacuum. In fact, apparatus 10 can be encapsulated in a vacuum if damping due to external influences is to be minimized. It is also possible to encapsulate only resonant probe 16 in a vacuum for the same purpose.

The damping due to movement of charge distribution 46 is proportional to the power losses inside conductor 12. Thus, a ring down or decay of the lateral oscillations of cantilever 18 is proportional to the damping caused by electronic drag. The power loss P inside conductor 12 is related to surface resistance r and current i by the well-know formula $P = i^2 r$. This means that damping due to electronic drag increases with increasing surface resistance. Hence, surface resistance can be derived from electronic drag, as explained in more detail below.

Determination of the damping caused by charge distribution 46 can be performed in several ways. In accordance with a convenient approach, cantilever 18 is set into lateral oscillatory motion at a frequency $\omega_o$ by drive 26. Frequency $\omega_o$ is preferably a resonant frequency of cantilever 18. No voltage difference, $V_S = 0$, is applied by source 32 between probe 16 and conductor 12. The ring down or decay of lateral oscillations is not affected by damping due to electronic drag in this situation. Instead, any other damping forces present, e.g., air resistance, will cause the oscillatory movement of cantilever 18 to decay or ring down. This ring down rate at zero voltage difference can be used as a baseline measurement.

In a second step, voltage difference, $V_S = V$, is applied between probe 16 and conductor 12 by source 32 while cantilever 18 is set into lateral oscillatory motion at frequency $\omega_o$ by drive 26. Now the ring down rate of the oscillations of cantilever 18 is much higher, since cantilever 18 also experiences damping caused by electronic drag. A comparison of the ring down rate at voltage difference $V_S = V$ with the baseline at zero voltage difference $V_S = 0$ is now used by processing unit 44 to calculate the damping action due to electronic-drag alone. In fact, unit 44 can just subtract the baseline from the ring down rate at $V_S = V$ to obtain the damping due to electronic drag alone.

Another approach to determining the damping caused by charge distribution 46 can be based on continuously driving cantilever 18 to oscillate at resonant frequency $\omega_o$. In this case no ring down time is measured. Instead, processing unit 44 calculates the amount of power required by drive 26 to maintain cantilever 18 oscillating at constant amplitude. This power is proportional to the power dissipated due to electronic drag and other damping forces. A baseline measurement can be used by unit 44 to subtract the baseline and obtain the power losses due to electronic drag alone.

It should be noted that several values of voltage difference $V_S$ and/or oscillation amplitudes of cantilever 18 can be used with any approach to determine the damping due to electronic drag. However, it is preferable to maintain the oscillation frequency $\omega_o$ of cantilever 18 below a value at which charge distribution 46 is no longer able to keep pace with the motion of tip 22. In other words, the effective RC time constant for the motion of charges 48 below tip 22 should be shorter than $1/\omega_o$. When this is no longer the case, cantilever 18 with a longer length L and hence a lower resonant frequency $\omega_o$ can be used.

In accordance with yet another approach, the damping produced by electronic drag is determined by measuring the quality factor also referred to as the Q factor of cantilever 18. For example, the Q factor can be determined from a measurement of the ring down time at various distances D set by stage 20 between tip 22 and conductor 12. FIG. 2 shows a plot of Q factor versus distance D for the case where conductor 12 is a silicon semiconductor material without a dielectric layer 14. The plot is obtained by progressively approaching cantilever 18 to conductor 12.

The total damping $\gamma$ experienced by cantilever 18 can be calculated by unit 44 from Q measurements based on the equation:

$$\gamma = \frac{k}{\omega_o Q}, \tag{1}$$

where k is the spring constant of cantilever 18. Using this relationship, the surface-induced damping $\gamma_S$ can be found by subtracting out the baseline or intrinsic damping of cantilever 18 in accordance to:

$$\gamma_s = \frac{k}{\omega_o}\left(\frac{1}{Q} - \frac{1}{Q_o}\right), \tag{2}$$

where $Q_o$ is the intrinsic value of cantilever 18 Q factor obtained far away from the surface of conductor 12.

The computation of damping due to electronic drag and electronic properties derived therefrom are now explained based on a study of a sample 50 of $p^+/p$ grated silicon as shown in FIG. 3. Sample 50 is measured by apparatus 10 and yields the damping image illustrated in FIG. 4. The lightly doped, high resistivity p-region has much higher damping than the heavily doped $p^+$-region. The doping dependence of the damping behavior can be understood by examining the dynamics of the flow of charge i beneath tip 22. As tip 22 moves across sample 50, the induced current i is proportional to $vq/\eta$, where v is the velocity of tip 22 and $q/\eta$ is related to the linear density of induced charge along the direction of motion of tip 22. Since the induced charge is $q = CV_S$, as explained above, the current i obeys the following relation:

$$i \propto \frac{vCV_S}{\eta}. \tag{3}$$

In general, the rate at which mechanical energy is removed from cantilever 18 is $-\frac{1}{2}\gamma_S v^2$ and is equal to the $i^2 r$ power losses in sample 50. Consequently, the damping due to electronic drag is given by:

$$\gamma_s \propto \left(\frac{CV_S}{\eta}\right)^2 r. \quad (4)$$

A person skilled in the art will recognize that for any particular sample the proportionality constant in relation (4) will generally differ and should be determined separately. Additionally, relationship (4) holds within a certain range of distances D of tip 22 from sample 50.

FIG. 5 shows the distance and voltage dependence of the damping over a typical silicon sample. Far away from the sample surface (D>100 nm), the damping has the $V_S^2$ dependence in accordance with relation (4). However, close to sample surface (D<50 nm) the $V_S^2$ dependence no longer holds. A person skilled in the art will recognize that these general guidelines provided by relation (4) can be experimentally obtained for each sample.

The effective resistance r can be approximated by using the well-known macroscopic relation:

$$r = \frac{L}{\sigma A}, \quad (5a)$$

where L is the distance through which instantaneous current i flows and A is the cross-sectional area through which current i passes and σ is the conductivity. Since current i instantaneously flows through a distance given by the width of charge distribution 48 or 2η (see FIG. 1), L 2η and since A 2ηL$_d$, the effective resistance in equation (4) can be rewritten as:

$$r = \frac{1}{\sigma L_d}. \quad (5b)$$

When conductor 12 being tested is a doped sample, then both σ and L$_d$ are functions of the doping concentration N when the charge carrier density is not significantly perturbed by band bending near the surface. The conductivity is then given by:

$$\sigma = e\mu N, \quad (6)$$

where e is the charge of charge carriers 48 and μ is their mobility. The Debye length, L$_d$, is also a function of doping concentration N and is given by:

$$L_d = \left(\frac{\varepsilon_s \varepsilon_o \varepsilon_b T}{e^2 N}\right)^{1/2}, \quad (7)$$

where k$_b$T is the thermal energy.

From these relations it follows that the damping due to electronic drag at a fixed voltage difference V$_S$ and a fixed distance D between tip 22 and conductor 12 is:

$$\gamma_s \propto \frac{1}{\mu N^{1/2}}. \quad (8a)$$

This relationship can also be expressed on a log-log plot as:

$$\log(\gamma_s \mu) = -\tfrac{1}{2}\log(N) + \text{constant}. \quad (8b)$$

This relationship was confirmed by measuring damping γ$_S$ due to electric drag with apparatus 10 in several uniformly doped n-type and p-type silicon wafers at a fixed distance D=300 nm using cantilever 18. Doping levels were independently determined using four point probe, measurements. Values for electron mobility (n-type) and hole mobility (p-type) were determined from well-known functions of the measured doping density. For additional information on these functions the reader is referred to Sze, *Physics of Semiconductor Devices*, 2nd edition, 1981, Chapter 7, pp. 362–379.

FIG. 5 is a plot of the measured relationship between damping γ$_S$ due to electronic drag, charge carrier mobility and doping density. Clearly, the method of invention works well over the range of doping concentrations from $10^{14}$ to $10^{18}$ cm$^{-3}$. Thus, electronic drag has a direct correlation to the doping concentration in the sample.

Figure 6:
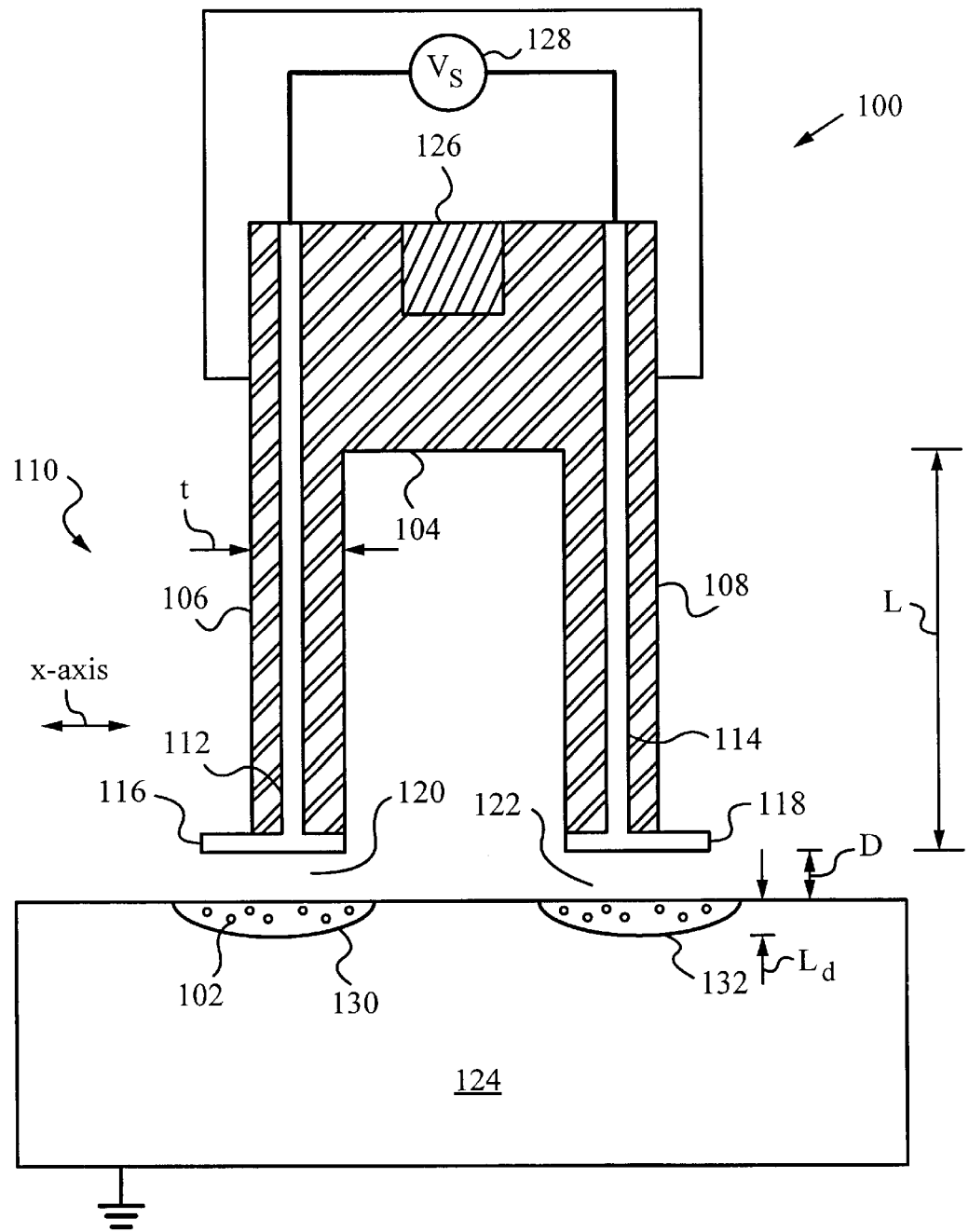
FIG. 6 is an isometric view illustrating another embodiment of the invention.

Another embodiment of an apparatus 100 for measuring electronic parameters of charge carriers 102 is illustrated in FIG. 6. Apparatus 100 has a resonator probe 104 with two resonant members 106, 108 in the form of parallel arms of length L and thickness t. In fact, members 106, 108 form a tuning fork 110. For measurements on millimeter scales, as is typically desired in industry, tuning fork 110 is a piezo-electric tuning fork quartz oscillator with conventional electronic circuitry.

Conductive traces or metal lines 112, 114 provided in members 106, 108 which are made of non-conductive quartz lead to conducting plates or capacitive plates 116, 118 respectively. Plates 116, 118 terminate tips 120, 122 of members 106, 108 and are substantially flat. Because of their geometry, plates 116, 118 provide for a large capacitance between them and conductor 124 positioned a distance D below them than the capacitance obtained in the previous embodiment using a cantilever with a rounded tip.

Tuning fork 110 is supported by a tuning fork support 126. A voltage source 128 is provided to supply the voltage for establishing a voltage difference between conductor 124 and plates 116 and 118. Conductor 124 is connected to ground.

In this embodiment conductor 124 is not covered with a dielectric. Gaps 126, 128 between plates 116, 118 are the only dielectric across which the measurement is performed.

During measurement electric drag is produced by charge distributions 130, 132 induced under plates 116, 118 when voltage difference V$_S$ is established between the plates and conductor 124. Lateral oscillations along the x-axis of resonant members 106, 108 are damped by the electronic drag, in accordance to the principles described above.

It should be noted that the method of invention can be used in conjunction with other methods, e.g., the C-V method to further improve the ability to determine electronic properties of the charge carriers near the surface of conductors.

The method of the invention is particularly useful for monitoring carrier mobility in the inversion layer underneath the gate-oxide prior to MOSFET fabrication. In addition to traditional silicon MOSFETs, the current method can be used to measure mobilities in conducting polymers used in organic semiconductor light emitting diodes and organic transistors.

The method and apparatus of invention are not limited to the above-described embodiment. For example, other designs can employ resonator members with more than two arms. The resonant member can be made in the form of a doubly supported ribbon or bridge. The manner of making such structures and their mechanics are known in the art.

The design of the apparatus can include micromachined resonators and can be made of materials with a high Q factor. Such materials include quartz, single-crystal silicon, polysilicon, GaAs and other materials. The design could also include integrated excitation and position sensing rather than separate drive and oscillation monitoring units. For example, piezoelectric devices can be used for piezoelectric excitation of mechanical oscillations and piezoresistive sensing. Therefore, the scope of the invention should be determined according to the appended claims and their legal equivalents.

We claim:

1. An apparatus for determining an electronic property of a conductor across a dielectric, said apparatus comprising:
   a) a resonator probe for positioning a predetermined distance from said conductor;
   b) a means for inducing lateral mechanical oscillations in said resonator probe;
   c) a voltage source for producing a voltage difference between said resonator probe and said conductor to create an electronic drag between said conductor and said resonator probe, thereby causing a damping of said lateral mechanical oscillations; and
   d) a means for determining said electronic property from said damping.

2. The apparatus of claim 1, wherein said means for inducing said lateral mechanical oscillations comprises a capacitive drive or integrated piezoelectric devices.

3. The apparatus of claim 1, wherein said means for determining said electronic property from said damping comprises an oscillation monitoring mechanism.

4. The apparatus of claim 3, wherein said oscillation monitoring mechanism comprises an optical oscillation monitoring system.

5. The apparatus of claim 3, wherein said oscillation monitoring mechanism comprises a processing circuit for determining said damping.

6. The apparatus of claim 3, wherein said oscillation monitoring mechanism comprises a processing circuit for determining the Q-factor of said resonator probe.

7. The apparatus of claim 1, further comprising a distance control for controlling said predetermined distance between said resonator probe and said conductor.

8. The apparatus of claim 1, wherein said resonator probe comprises at least one resonator member.

9. The apparatus of claim 8, wherein said resonator probe comprises two parallel resonator members forming a tuning fork.

10. The apparatus of claim 8, wherein said resonator probe comprises one resonator member in the form of a cantilever.

11. The apparatus of claim 1, wherein said voltage source is a source for producing a positive voltage difference and a negative voltage difference.

12. The apparatus of claim 1, wherein said electronic property is selected from the group consisting of quantity of charge carriers, surface mobility of charge carriers, surface resistivity and charge carrier lifetime.

13. The apparatus of claim 1, wherein said conductor is selected from the group consisting of metal conductors, semiconductors, conducting polymers and organic conductors.

14. The apparatus of claim 1, wherein said dielectric is selected from the group consisting of air, oxides, passivation layers, protective layers.

15. A method for determining an electronic property of a conductor across a dielectric, said method comprising:
    a) positioning a resonator probe a predetermined distance away from said conductor;
    b) inducing lateral mechanical oscillations in said resonator probe;
    c) producing a voltage difference between said resonator probe and said conductor such that an electronic drag is created between said conductor and said resonator probe, thereby causing a damping of said lateral mechanical oscillations; and
    d) determining said electronic property from said damping.

16. The method of claim 15, wherein said step of determining said electronic property comprises:
    a) monitoring the damping action of said electronic drag;
    b) calculating said electronic property from said damping action.

17. The method of claim 15, wherein said step of determining said electronic property comprises:
    a) monitoring the Q-factor of said resonator probe;
    b) calculating said electronic property from said Q-factor.

18. The method of claim 15, wherein said resonator probe is operated in a vacuum.

19. The method of claim 15, wherein said resonator probe is encapsulated in a vacuum.

* * * * *